United States Patent
Yamauchi et al.

(10) Patent No.: US 8,436,494 B2
(45) Date of Patent: May 7, 2013

(54) TOUCH SENSOR DEVICE AND TOUCH SENSOR PROGRAM

(75) Inventors: Kazuto Yamauchi, Okazaki (JP); Yasunori Murayama, Ichinomiya (JP); Sadahiko Tanaka, Okazaki (JP); Keitaro Takizawa, Okazaki (JP); Kouichi Yamanoue, Yokohama (JP); Arihiro Isomura, Kariya (JP); Kenji Kishiue, Okazaki (JP)

(73) Assignee: Mitsubishi Jidosha Kogyo Kabushiki Kaisha, Tokyo (JP)

( * ) Notice: Subject to any disclaimer, the term of this patent is extended or adjusted under 35 U.S.C. 154(b) by 371 days.

(21) Appl. No.: 12/744,449

(22) PCT Filed: Oct. 9, 2008

(86) PCT No.: PCT/JP2008/068394
§ 371 (c)(1),
(2), (4) Date: May 24, 2010

(87) PCT Pub. No.: WO2009/072349
PCT Pub. Date: Jun. 11, 2009

(65) Prior Publication Data
US 2010/0252408 A1    Oct. 7, 2010

(30) Foreign Application Priority Data
Dec. 7, 2007  (JP) ................... 2007-317739

(51) Int. Cl.
*H02B 1/24*     (2006.01)
*H01H 83/00*   (2006.01)

(52) U.S. Cl.
USPC .......................................... 307/112; 307/116

(58) Field of Classification Search ............ 307/112, 307/116
See application file for complete search history.

(56) References Cited

U.S. PATENT DOCUMENTS 6,998,545 B2 *  2/2006  Harkcom et al. .......... 178/18.02

FOREIGN PATENT DOCUMENTS

| JP | 55-111028 A  | 8/1980 |
| JP | 2-26126 A    | 1/1990 |
| JP | 7-297689 A   | 11/1995 |
| JP | 8-5659 A     | 1/1996 |
| JP | 10-304471 A  | 11/1998 |
| JP | 11-74767 A   | 3/1999 |
| JP | 11-136116 A  | 5/1999 |
| JP | 2005-078104 A | 3/2005 |
| JP | 2007-150733 A | 6/2007 |

* cited by examiner

*Primary Examiner* — Hal Kaplan
(74) *Attorney, Agent, or Firm* — Birch, Stewart, Kolasch & Birch, LLP

(57) ABSTRACT

A touch sensor device comprises: a touch sensor 1 for sending out an output voltage signal S1 representing the presence or absence of an operation; an operation presence/absence determination unit 2 which, when the output voltage signal has a value equal to or more than a predetermined threshold value, determines that the operation has occurred; a stability determination unit 5 for detecting whether a differential signal S3 representing a differential value obtained by differentiating the output voltage signal is limited within a predetermined range or not; and a count-up timer 4 which, when a period during which the differential signal is limited within the predetermined range becomes a predetermined time period or longer on the premise that the output voltage signal has the value equal to or more than the predetermined threshold value, sends out an ON determination signal S5 and allows an external device 7 to operate.

6 Claims, 3 Drawing Sheets

TOUCH SENSOR DEVICE AND TOUCH SENSOR PROGRAM

BACKGROUND OF THE INVENTION

1. Field of the Invention

This invention relates to a touch sensor device and a touch sensor program, especially, those which are useful when applied to an in-vehicle touch sensor device.

2. Description of the Related Art

A touch sensor device finds general purpose use in various industrial fields as an input device which is an interface of various types of instruments. Such a touch sensor device is advantageous in that an operator can operate the instrument merely by touching an arbitrary detection electrode (touch switch) in a touch sensor and, in this respect, can easily perform a predetermined operation. On the other hand, the instrument acts, even when the operator touches the detection electrode unintentionally. Thus, the touch sensor device has the problem that a malfunction is apt to occur. A so-called groping or blind operation, such as for locating the position of the detection electrode, also causes unintended actuation. Such a blind operation becomes a noticeable problem, particularly when operating an in-vehicle instrument while driving a vehicle.

Under these circumstances, conventional technologies have proposed, for example, the following measures: A period during which an output voltage from the touch sensor is equal to or more than a predetermined threshold value—a state assumed to represent a touch on or contact with the detection electrode—is counted with a timer and, when this period is a predetermined time period or longer, an ON determination is made (see Patent Document 1). Alternatively, irregularities are created in the shape of the detection electrode to facilitate the blind operation (see Patent Document 2).

Patent Document 1
JP-A-08-005659
Patent Document 2
JP-A-2005-078104

SUMMARY OF THE INVENTION

Problems to be solved by the Invention

If it is attempted to improve malfunction preventing performance in counting with the timer, however, a delay in the response time of the instrument is problematical. In the case of a slow groping operation on the detection electrode having a large contact area, or with a contact operation such as cleaning, moreover, the threshold value or more for the ON determination is easily reached to cause a malfunction. If the irregularities are imparted to the shape of the detection electrode, on the other hand, a groping operation on the irregular surface for the desired detection electrode similarly causes a malfunction, unless the operation is performed under pressing force of a certain value or less. Thus, the operator needs to be accustomed to the operation. This poses a problem about practical applicability.

The present invention has been accomplished in the light of the above-described conventional technologies. It is an object of the present invention to provide a touch sensor device and a touch sensor program which can reduce malfunctions and enable even a groping operation to make an ON determination corresponding to the operation reliably.

Means for Solving the Problems

A first aspect of the present invention, intended to attain the above object, is a touch sensor device, comprising:

a touch sensor for converting presence or absence of an operation into a voltage value, and sending out an output voltage signal representing the voltage value;

operation presence/absence determination means which, when the output voltage signal has a value equal to or more than a predetermined threshold value, determines that the touch sensor is in an operated state;

stability determination means for detecting whether a differential signal representing a differential value obtained by differentiating the output voltage signal is limited within a predetermined range or not; and count-up timer means which detects a period during which the differential signal is limited within the predetermined range on a premise that the output voltage signal has the value equal to or more than the threshold value and, when the period becomes a predetermined time period or longer, sends out an ON determination signal and allows an external device to operate.

According to this aspect, the ON determination is made when it has been detected that the differential signal based on the output voltage signal is limited within the predetermined range for a time equal to or more than a set time, which has been preset, on the premise that the output voltage signal has the value equal to or more than the predetermined threshold value. Thus, malfunctions of the touch sensor device can be reduced dramatically.

A second aspect of the present invention is the touch sensor device according to the first aspect, wherein two of the threshold values having a relation, a first of the threshold values>a second of the threshold values, are set, and the operation presence/absence determination means is configured to determine that the operated state is attained when the value of the output voltage signal increases to the first threshold value or more, and to determine that the operated state is released when the value of the output voltage signal decreases to less than the second threshold value.

According to the above aspect, the two different threshold values, i.e., the first and second threshold values, are set such that the determination conditions for the operated state of the touch sensor during the increase in the output voltage signal are strict, and the determination conditions for the operated state of the touch sensor during the decrease in the output voltage signal are mild. Thus, chattering ascribed to the output voltage signal fluctuating astride the first threshold value can be prevented effectively, and the most appropriate ON determination signal for prevention of a malfunction can be formed.

A third embodiment of the present invention is the touch sensor device according to the first or second embodiment, wherein the predetermined range in the stability determination means is adjustable according to an amount of change in the output voltage signal.

According to the above aspect, it is possible to make adjustment of the predetermined range while taking into consideration differences in the area of contact in operating the touch sensor. Thus, the optimum predetermined range conformed to the area of contact can be set, and an accurate ON determination can be made correspondingly. This is because a change in the area of contact may lead to a great change in the output voltage signal or its variation.

A fourth aspect of the present invention is the touch sensor device according to any one of the first to third aspects, wherein the touch sensor is an electrostatic capacity touch sensor.

According to the above aspect, even when the output voltage signal is greatly different between the operation of the touch sensor by the bare hand and the operation of the touch sensor by the gloved hand, for example, the aforementioned characteristic conspicuous actions of the present invention can prevent malfunctions effectively.

A fifth aspect of the present invention is the touch sensor device according to any one of the first to fourth aspects, wherein the ON determination signal actuates an in-vehicle device.

According to this aspect, the touch sensor device is configured to be an in-vehicle touch sensor device having a high possibility for a groping operation. Thus, the aforementioned characteristic effects of the present invention can be exhibited remarkably.

A sixth aspect of the present invention is a program for a touch sensor device, which accomplishes the following functions in a computer:

a function of determining, when an output voltage signal representing presence or absence of an operation on a touch sensor has a value equal to or more than a predetermined threshold value, that the touch sensor is in an operated state;

a function of detecting whether a differential signal representing a differential value obtained by differentiating the output voltage signal is limited within a predetermined range or not; and a function of detecting a period during which the differential signal is limited within the predetermined range on a premise that the output voltage signal has the value equal to or more than the threshold value and, when the period becomes a predetermined time period or longer, sending out an ON determination signal and allowing an external device to operate.

According to this aspect, the aforementioned characteristic marked effects of the present invention can be achieved by a computer program.

Effects of the Invention

According to the present invention, the ON determination is made when it has been detected that the differential signal representing the differential value of the output voltage signal representing the output voltage of the touch sensor is limited within the predetermined range for a time equal to or more than the set time, which has been preset, on the premise that the output voltage signal has the value equal to or more than the predetermined threshold value. No ON determination is made simply by the fact that the output voltage signal becomes equal to or more than the threshold value for ON determination. Thus, malfunctions of the touch sensor device can be reduced dramatically. Particularly when the operator gropes on the surface of the detection electrode of the touch sensor, the output voltage signal changes in terms of time, and the differential signal deviates from the predetermined range. As a result, no ON determination is made. Hence, a reliable ON determination reflecting the operator's intention can be made.

DESCRIPTION OF REFERENCE NUMERALS

Figure 1:
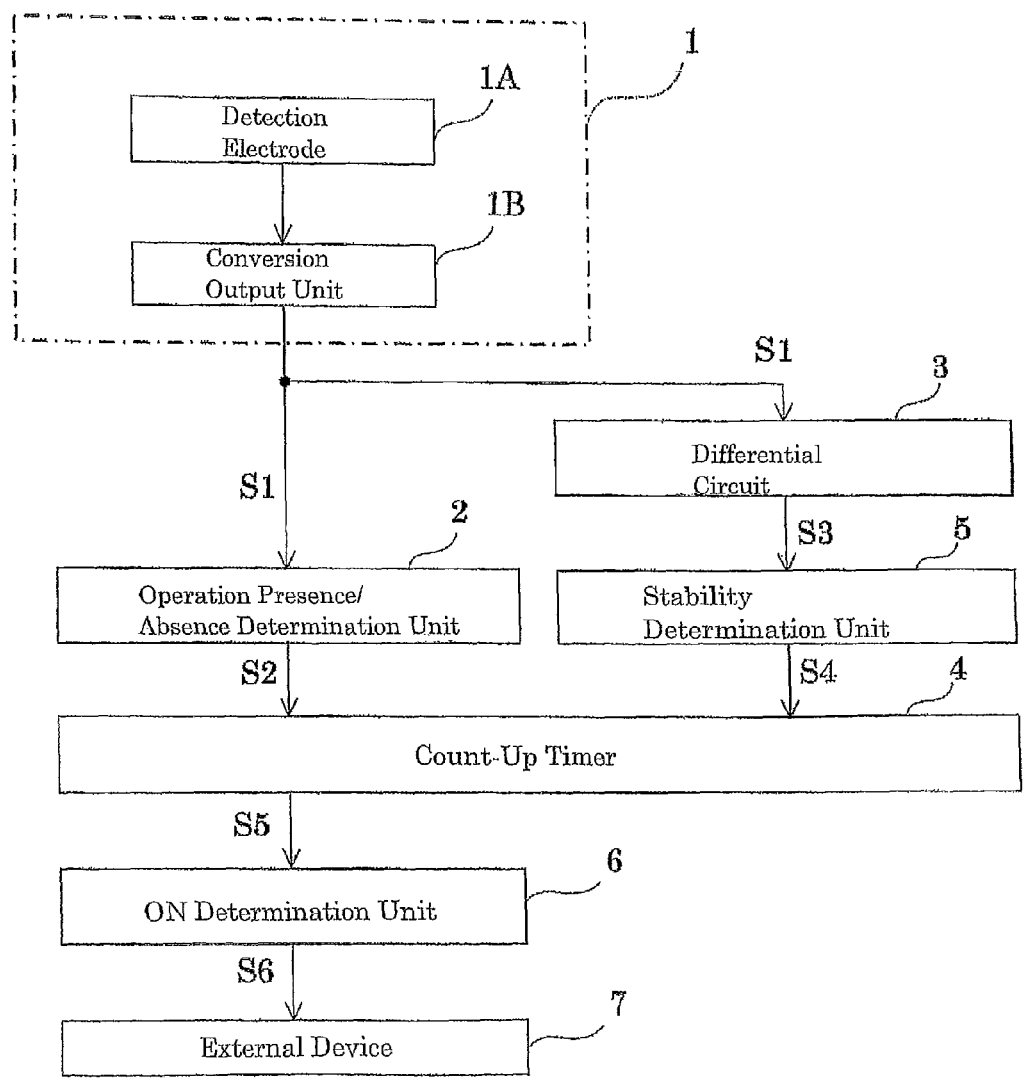
FIG. 1 A block diagram showing a touch sensor device according to an embodiment of the present invention.

1 Touch sensor
2 Operation presence/absence determination unit
3 Differential circuit
4 Count-up timer
5 Stability determination unit
6 ON determination unit
7 External device
S1 Output voltage signal
S3 Differential signal
S5 ON determination signal

DETAILED DESCRIPTION OF THE INVENTION

An embodiment of the present invention will be described in detail based on the accompanying drawings.

FIG. 1 is a block diagram showing a touch sensor device according to an embodiment of the present invention. FIGS. 2(a) to 2(g) are waveform charts showing the waveforms of signals in respective portions of this touch sensor device. As shown in FIG. 1, a touch sensor 1 in the present embodiment is of an electrostatic capacity type, and has a detection electrode 1A and a conversion output unit 1B with which an operator makes finger contact for a predetermined operation. Here, the detection electrode 1A outputs a change in electrostatic capacity, caused upon contact with the operator's finger, to the conversion output unit 1B. The conversion output unit 1B converts the change in electrostatic capacity into a voltage value, and sends out an output voltage signal S1 representing this voltage value to an operation presence/absence determination unit 2 and a differential circuit 3.

Figure 2:
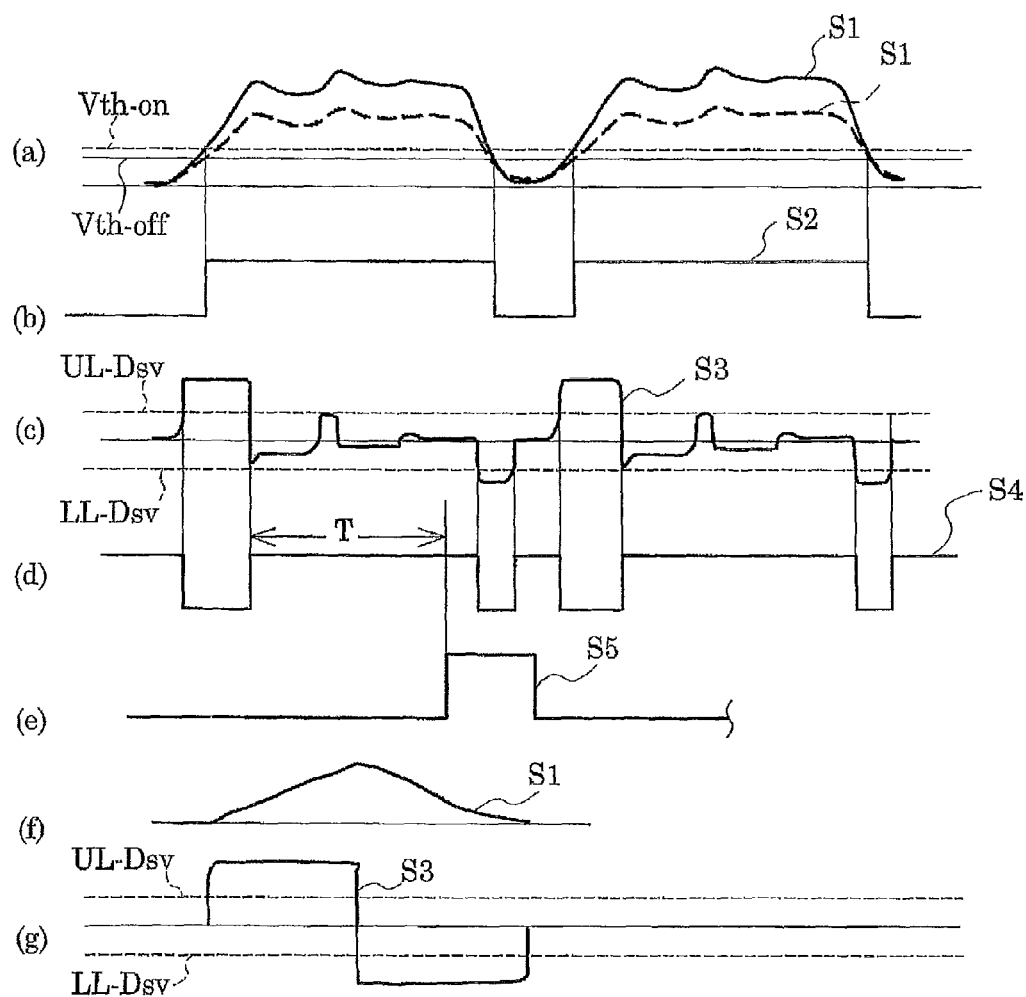
FIGS. 2(a) to 2(g) Waveform charts showing the waveforms of signals in respective portions of the touch sensor device shown in FIG. 1.

An example of the output voltage signal S1 in this case is shown in FIG. 2(a). Of two of the output voltage signals S1 shown in this drawing, a waveform indicated by a solid line represents the signal upon operation by a bare hand, while a waveform indicated by a dashed line represents the signal upon operation by a gloved hand (detailed descriptions will be offered later in this connection).

The operation presence/absence determination unit 2 compares the output voltage signal S1 with predetermined threshold values Vth-on, Vth-off to detect that the output voltage signal S1 when increased has become the predetermined threshold value Vth-on or more, also detect that the output voltage signal S1 when decreased has become less than the predetermined threshold value Vth-off, and sends out an output signal S2 representing these facts to a count-up timer 4. Here, these values are set such that Vth-on is larger than Vth-off. Thus, as shown in FIG. 2(b), the output signal S2 becomes a pulse signal which rises at a time when S1 reaches the threshold value Vth-on, and falls at a time when S1 becomes less than the threshold value Vth-off. In the present embodiment, the two threshold values, the threshold value Vth-on and the threshold value Vth-off, are set, but so setting is not essential. Setting the two threshold values Vth-on and Vth-off as in the present embodiment, however, can prevent chattering ascribed to the output voltage signal S1 fluctuating astride the threshold value Vth-on.

The differential circuit 3 differentiates the output voltage signal S1, and sends out a differential signal S3 representing a differential value obtained by the differentiation. An example of the differential signal S3 in this case is shown in FIG. 2(b).

A stability determination unit 5 detects whether a change in the differential signal S3 is limited within a predetermined range. When this change is limited within the predetermined range, the stability determination unit 5 determines that the operator is making contact with the detection electrode 1A with the intention to operate, and sends out an output signal S4 representing this fact to the count-up timer 4. In further detail, the stability determination unit 5 is designed to set two threshold values UL-Dsv and LL-Dsv at different levels (UL-Dsv>LL-Dsv), and to send out the output signal S4 which is a pulse signal entering an H-state when UL-Dsv≧S3≧LL-Dsv. This can be easily realized by a window comparator function with UL-Dsv and LL-Dsv as threshold values.

When it has been detected that the differential signal S3 is limited within the predetermined range during a period equal to or more than a predetermined time period T on the premise that the output voltage signal S1 when increased is the threshold value Vth-on or more, or the output voltage signal S1 when decreased is the threshold value Vth-off or more, that is, the output signal S2 is in the H-state, the count-up timer 4 sends out an ON determination signal S5 representing these facts. Here, the count-up timer 4 can be realized, for example, by the following features: That is, the period during which the output signal S4 is in the H-state is counted with a timer which can count up on condition that the output signal S2 is in the H-state. At a time when its count value reaches a predetermined count value, the ON determination signal S5 as shown in FIG. 2(e) is sent out.

An ON determination unit 6 judges the intention of the operator to perform an ON operation by the ON determination signal S5, and sends out an actuation signal S6 for actuating a predetermined external device 7. The external device 7 is actuated by this actuation signal S6.

According to the present embodiment, as described above, an ON determination is made when it has been detected that the differential signal S3, which represents the differential value of the output voltage signal S1, is limited within the predetermined range (UL-Dsv≧S3≧LL-Dsv) for a certain time or more on the premise that the output voltage signal S1 when increased is the threshold value Vth-on or more, or the output voltage signal S1 when decreased is the threshold value Vth-off or more. Here, as indicated by the dashed line in FIG. 2(a), the value of the output voltage signal S1 is smaller when the touch sensor 1 is operated by the gloved hand than when the touch sensor 1 is operated by the bare hand. Such a phenomenon is markedly problematical when using the touch sensor 1 of the electrostatic capacity type undergoing great influences due to differences in the dielectric constant in the respective cases. This is because if it is attempted to detect the operation when a glove is worn, the threshold value has to be rendered low, but so rendering the threshold value low may result in an excessive detection sensitivity for the operation by the bare hand, and may easily induce a malfunction. In this connection, according to the present embodiment, ON determination is not made simply when the value of the output voltage signal S1 has become the threshold Vth-on or more for ON determination. Thus, it is possible to set the threshold value Vth-on at a low value in correspondence with the operation using the gloved hand. Nevertheless, in the presence of the threshold value Vth-on set at such a low value, operation using the bare hand would not cause a malfunction. That is, in the present embodiment, it is possible to achieve the prevention of a malfunction adaptable satisfactorily to both of the operation by the bare hand and the operation by the gloved hand.

Furthermore, the sensitivity of the touch sensor 1 is set to be high, that is, the threshold value Vth-on is set at a low value. Thus, even when the output voltage signal S1 becomes the threshold value Vth-on or more before the tip of the operator's finger contacts the detection electrode 1A, the position of the fingertip is not stable, while the operator's finger is moving in a space. In this state, therefore, the differential signal S3 is not limited in the predetermined range. Only in a state where the fingertip contacts the detection electrode 1A and its position has stabilized, an ON determination can be made. Consequently, a malfunction can be reliably prevented correspondingly.

FIGS. 2(a) to 2(e), on which the foregoing explanations are based, are waveform charts obtained in an ordinary mode of operation, namely, a mode in which the operator has operated the detection electrode 1A with the intention to operate. On the other hand, FIGS. 2(f) and 2(g) are waveform charts showing the output voltage signal S1 obtained when the operator touches the detection electrode 1A accidentally without the intention to operate, as in a groping state (FIG. 2(f)), and the differential voltage signal S3 based on this output voltage signal S1 (FIG. 2(g)). As shown in both drawings, the output voltage signal S1 greatly changes in terms of time in this case, with the result that its differential signal S3 changes in a wide range beyond the predetermined range (UL-Dsv≧S3≧LL-Dsv). As a result, the count-up timer 4 does not count up, so that the ON determination signal S5 is not sent out.

Figure 3:
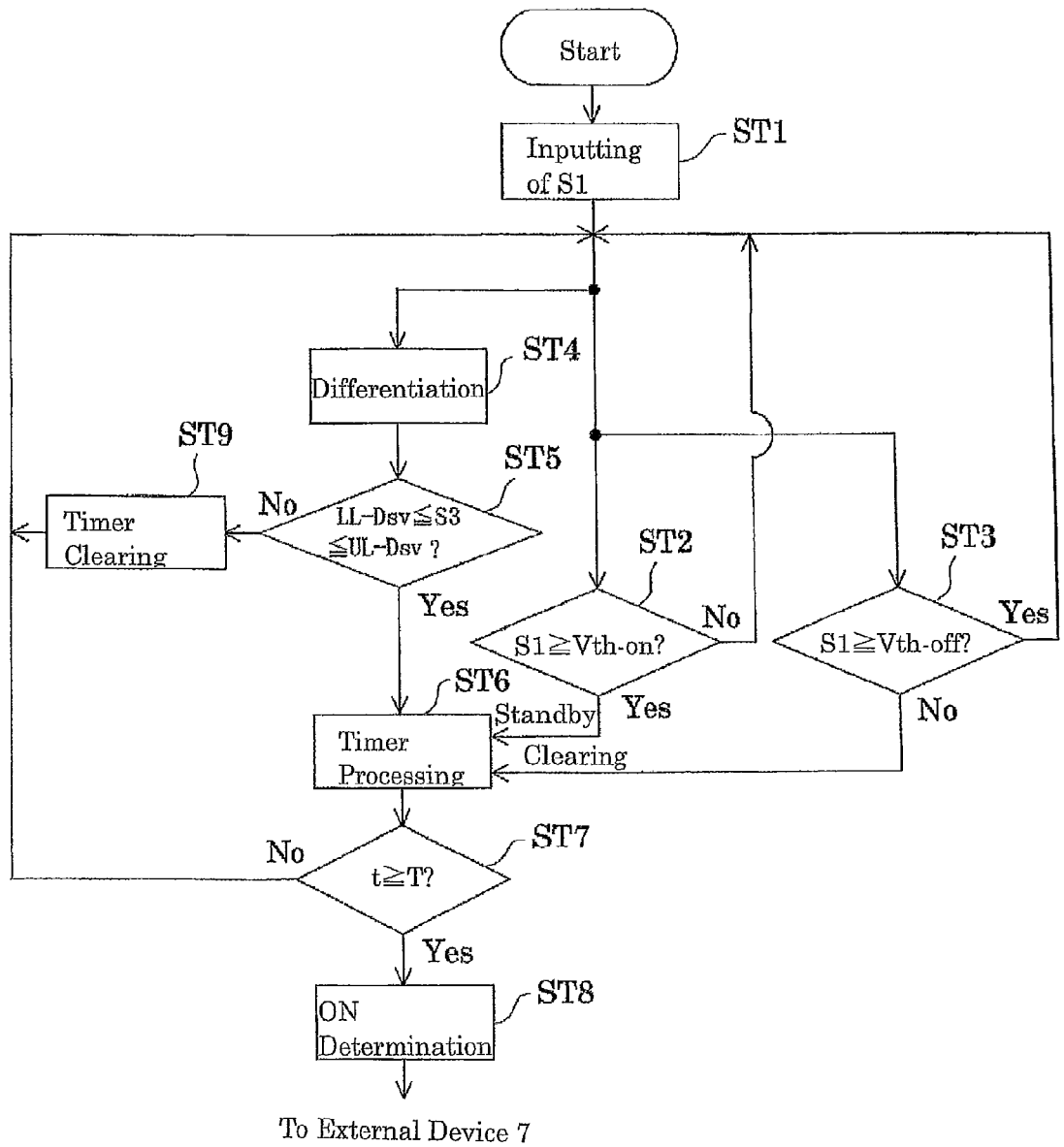
FIG. 3 A flowchart showing the procedure for signal processing in the touch sensor device shown in FIG. 1.

FIG. 3 is a flowchart showing the procedure for signal processing in the touch sensor device according to the present embodiment. In this signal processing system, as shown in the drawing, the output voltage signal S1 sent out by the touch sensor 1 (see FIG. 1) is inputted (see Step ST1).

Then, it is determined whether the output voltage signal S1≧the threshold value Vth-on or not (see Step ST2), and it is also determined whether the output voltage signal the threshold value Vth-off or not (see Step ST3). Simultaneously, differentiation of the output voltage signal S1 is performed (see Step ST4).

If the determination in Step ST2 shows that the output voltage signal S1≧the threshold value Vth-on, the count-up timer 4 (see FIG. 1) is placed in a standby state. If the output voltage signal S1<the threshold value Vth-on, on the other hand, the program returns to the beginning, and the processings in Step ST2 to Step ST4 are repeated.

Then, upon receipt of the results of the differentiation of the output voltage signal S1 (see Step ST4), it is determined whether the differential signal S3 is limited within the predetermined range, that is, whether the threshold value LL-Dsv≦S3≦the threshold value UL-Dsv or not (see Step ST5).

Then, based on the results of determination in Step ST5 and on condition that the count-up timer 4 is on standby, the period during which the threshold value LL-Dsv≦S3≦the threshold value UL-Dsv is counted up (see Step ST6). That is, the count-up timer 4 counts up the period t during which the threshold value LL-Dsv≦S3≦the threshold value UL-Dsv only in the standby state where counting-up is possible.

Then, it is determined whether the counted-up period t is equal to or more than the set period T which has been preset (see Step ST7). If the processing in Step ST7 has resulted in the detection that t≧T, an ON determination is made (see Step ST8) to actuate the predetermined external device 7 (see FIG. 1). If t<T, the program returns to the beginning, repeating the processings in Steps ST2 to ST4.

If the processing in Step ST3 has determined that the output voltage signal S1≧the threshold value Vth-off, the program returns to the beginning, and repeats the processings in Steps ST2 to ST4. If the processing in Step ST3 has determined that the output voltage signal S1<the threshold value Vth-off, on the other hand, the count-up timer 4 is cleared (see Step ST6).

In a case where the processing in Step ST5 has found that the differential signal S3<the threshold value LL-Dsv or the differential signal S3>the threshold value UL-Dsv, the count-up timer 4 is similarly cleared (see Step ST9). Then, the program returns to the beginning, repeating the processings in Steps ST2 to ST4.

The threshold values UL-Dsv and LL-Dsv set in the stability determination unit 5 of the above-described embodiment are taken as fixed values, but may be designed to be adjustable according to the amount of change in the output voltage signal S1. In this case, it is possible to set the optimum predetermined range (UL-Dsv≧S3≧LL-Dsv) taking into consideration differences in the area of contact in operating the touch sensor 1. Incidentally, when the area of contact between the finger and the detection electrode 1A increases, as in a case where the detection electrode 1A (see FIG. 1) is touched with the thickest part of the finger, the output voltage signal S1 and its variation also change greatly in proportion to the increase. If the above predetermined range (UL-Dsv≧S3≧LL-Dsv) is fixed, therefore, there may be a case where an ON determination is not made in spite of the contact with the detection electrode 1A, and an erroneous outcome is detected.

Further, the touch sensor 1 in the above embodiment has been described as that of the electrostatic capacity type, but need not be limited thereto. There are no particular limitations on its type, as long as it is a touch sensor for transmitting the operator's intention via a switch, such as that of a pressing type or a piezoelectric type. With the electrostatic capacity type touch sensor, however, particularly remarkable actions and effects can be exhibited, as mentioned above.

The functions of the touch sensor device according to the embodiment mentioned above can be accomplished as a program for their accomplishment in a computer.

INDUSTRIAL APPLICABILITY

The present invention can be used for a touch switch utilized in various industrial fields, and can be utilized in industrial fields where devices using the touch switch are produced and sold.

The invention claimed is:

1. A touch sensor device, comprising:
a touch sensor for converting presence or absence of an operation into a voltage value, and sending out an output voltage signal representing the voltage value;
operation presence/absence determination means which, when the output voltage signal has a value equal to or more than a first threshold value, determines that the touch sensor is in an operated state;
stability determination means for detecting whether or not a differential signal representing a differential value obtained by differentiating the output voltage signal is limited within a predetermined range defined by a third threshold value defining an upper limit and a fourth threshold value defining a lower limit; and
count-up timer means which detects a period during which the differential signal is limited within the predetermined range on a premise that the output voltage signal has the value equal to or more than the first threshold value and, when a time based on the period becomes a fifth threshold value or more, sends out an ON determination signal and allows an external device to operate.

2. The touch sensor device according to claim 1, wherein
the operation presence/absence determination means sets two threshold values having a relation, wherein one of the threshold values>the other of the threshold values, wherein the one of the threshold values is the first threshold value, and
the operation presence/absence determination means is configured to determine that the operated state is attained when the value of the output voltage signal increases to the one threshold value or more, and to determine that the operated state is released when the value of the output voltage signal decreases to less than the other threshold value.

3. The touch sensor device according to claim 1, wherein
the predetermined range in the stability determination means is adjustable according to an amount of change in the output voltage signal.

4. The touch sensor device according to claim 1, wherein the touch sensor is an electrostatic capacity touch sensor.

5. The touch sensor device according to claim 1, wherein the ON determination signal actuates an in-vehicle device.

6. A non-transitory computer-readable storage medium storing a program for a touch sensor device, which accomplishes the following functions in a computer:
a function of determining, when an output voltage signal representing presence or absence of an operation on a touch sensor has a value equal to or more than a first threshold value, that the touch sensor is in an operated state;
a function of detecting whether or not a differential signal representing a differential value obtained by differentiating the output voltage signal is limited within a predetermined range defined by a third threshold value defining an upper limit and a fourth threshold value defining a lower limit; and
a function of detecting a period during which the differential signal is limited within the predetermined range on a premise that the output voltage signal has the value equal to or more than the first threshold value and, when a timing based on the period becomes a fifth threshold value or more, sending out an ON determination signal and allowing an external device to operate.

* * * * *